United States Patent [19]

Schimpe

[11] Patent Number: 4,869,568
[45] Date of Patent: Sep. 26, 1989

[54] ARRANGEMENT COMPRISING A PLANARLY EXTENDING THIN-FILM WAVEGUIDE

[75] Inventor: Robert Schimpe, Munich, Fed. Rep. of Germany

[73] Assignee: Siemens Aktiengesellschaft, Berlin and Munich, Fed. Rep. of Germany

[21] Appl. No.: 250,515

[22] Filed: Sep. 29, 1988

[30] Foreign Application Priority Data

Sep. 29, 1987 [DE] Fed. Rep. of Germany ....... 3732821
Aug. 26, 1988 [EP] European Pat. Off. ........ 88113987.7

[51] Int. Cl.$^4$ .......................... G02B 6/10; H01S 3/19; H01L 33/00; H03H 9/00
[52] U.S. Cl. .............................. 350/96.12; 350/96.13; 350/96.19; 350/162.2; 350/162.23; 350/162.24; 372/44; 372/45; 357/17; 333/195
[58] Field of Search ............... 350/96.11, 96.12, 96.13, 350/96.14, 96.15, 96.16, 96.19, 162.2, 162.22, 162.23, 162.24; 372/44, 45, 47, 48, 96; 357/17, 19; 333/141, 150, 193, 195

[56] References Cited

U.S. PATENT DOCUMENTS

| | | | |
|---|---|---|---|
| 3,868,589 | 2/1975 | Wang | 350/96.12 |
| 3,906,432 | 9/1975 | Ash | 333/153 |
| 3,931,598 | 1/1976 | Bongianni | 333/150 X |
| 3,944,326 | 3/1976 | Tacke et al. | 350/96.34 X |
| 3,970,958 | 7/1976 | Streifer et al. | 372/96 |
| 3,970,959 | 7/1976 | Wang et al. | 372/23 X |
| 3,982,810 | 9/1976 | Tamir et al. | 350/96.12 X |
| 4,006,432 | 2/1977 | Streifer et al. | 372/44 X |
| 4,082,425 | 4/1978 | Miller | 350/96.19 X |
| 4,255,717 | 3/1981 | Scifres et al. | 331/94.5 |
| 4,719,636 | 1/1988 | Yamaguchi et al. | 372/96 |
| 4,740,987 | 4/1988 | McCall, Jr. et al. | 372/45 |
| 4,743,083 | 5/1988 | Schimpe | 350/96.19 |
| 4,751,710 | 6/1988 | Yamaguchi et al. | 372/44 X |
| 4,795,236 | 1/1989 | Ise | 350/162.2 |
| 4,803,690 | 2/1989 | Takiguchi et al. | 372/45 |

FOREIGN PATENT DOCUMENTS 0228088 7/1987 European Pat. Off. ..... 350/96.19 X
60-186083 9/1985 Japan ........................... 350/96.12 X

OTHER PUBLICATIONS

Kojima et al., "Edge-and Surface-Emitting Distributed Bragg Reflector Laser with Multiquantum Well Active/Passive Waveguides", *Appl. Phys. Lett.* 50(5), Feb. 2, 1987, pp. 227–229.

Miyamoto et al., "GaInAsP/InP Single Quantum-Well Lasers by OMVPE", *Japanese Journal of Applied Physics*, vol. 26, No. 3, Mar. 1987, pp. L176–L178.

Boetz et al., "Single-Mode Positive-Index Guided cw Constricted Double-Heterojunction Large-Optical-Cavity AlGaAs Lasers with Low Threshold-Current Temperature Sensitivity", *Appl. Phys. Lett.* 38(9), May. 1, 1981, pp. 658–660.

(List continued on next page.)

Primary Examiner—William L. Sikes
Assistant Examiner—Brian M. Healy
Attorney, Agent, or Firm—Hill, Van Santen, Steadman & Simpson

[57] ABSTRACT

An arrangement comprising a planarly extending thin-film waveguide, which is particularly useful when employed with devices that require a relatively high power and highly focused laser radiation. The arrangement comprises a planarly extending thin-film waveguide of a structure composed of a plurality of strip waveguides proceeding at a distance next to one another and a diffraction grating having rulings of a grating proceeding in a direction perpendicular to the running direction of the strip waveguides. The spacing between the neighboring rulings of the waveguides is equal to either the wave length of the wave being propagated in the thin-film waveguide or to a multiple of the wave length, and the wave is either an electromagnetic wave or an acoustical wave.

33 Claims, 3 Drawing Sheets

OTHER PUBLICATIONS

Derry et al., "Ultralow-Threshold Graded-Index Separate-Confinement Single Quantum Well Buried Heterostructure (Al,Ga)As Lasers with High Reflectivity Coatings", *Appl. Phys. Lett.* 50(25), Jun. 22, 1987, pp. 1773–1775.

Ishida et al., "Fabrication of Index-Guided AlGaAs Multiquantum Well Lasers with Buried Optical Guide by Si-Induced Disordering", *Japanese Journal of Applied Physics,* vol. 25, No. 8, Aug. 1986, pp. L690–L692.

Noblanc "Trends in Quantum Well Devices" *Surface Science,* vol. 168 (1986) pp. 847–851.

Glick et al., "Quadratic Electro-Optic Light Modulation in a GaAs/AlGaAs Multiquantum Well Heterostructure near the Excitonic Gap" *Appl. Phys. Lett.,* vol. 48, No. 15, Apr. 14, 1986, pp. 989–991.

Hammer et al., "Phase-Locked Operation of Coupled Pairs of Grating-Surface-Emitting Diode Lasers" *Appl. Phys. Lett.,* vol. 50, No. 11, Mar. 16, 1987, pp. 659–661.

4,869,568

ARRANGEMENT COMPRISING A PLANARLY EXTENDING THIN-FILM WAVEGUIDE

BACKGROUND OF THE INVENTION

The present invention is directed to an arrangement comprising a planarly extending thin-film waveguide.

SUMMARY OF THE INVENTION

The object of the present invention is to provide an arrangement of a thin-film waveguide, wherein coupling or joining of waves guided in the thin-film waveguide and an outcoupling and/or an incoupling of these waves from and/or into the planar thin-film waveguide is enabled.

This object is achieved in an improvement in an arrangement comprising a planarly extending thin-film waveguide, with the improvement being that the structure is composed of a plurality of strip waveguides proceeding at a distance next to one another and a diffraction grating comprising rulings of the grating proceeding in a direction transversely relative to the running direction of the strip waveguides at the thin-film waveguide, said grating having spacing between neighboring rulings of the grating being at least equal to half the wave length of the waves being propagated in the thin-film waveguide, which waves may be either electromagnetic or acoustical. The spacing may be a whole wave length of the wave.

It is important that the waves guided along the strip waveguide and in the thin-film waveguide must be in interaction with the diffraction grating in the arrangement of the invention. In addition, the diffraction grating couples the guided wave into a beam that resides or extends perpendicular to the running direction of the strip waveguides and perpendicular to the rulings of the grating and which beam is focused onto a point.

Preferably, the structure of the strip waveguides and the diffraction grating are superimposed on one another. Preferably, the diffraction grating will comprise an inner grating region having a first or one spacing between neighboring rulings of the grating and with the inner grating region being arranged between two outer grating regions of the grating having a different second spacing between neighboring rulings of the grating, this different second spacing being half as large as the first spacing between the neighboring rulings of the inner grating.

The diffraction grating having the one spacing and inner portion or inner grating between neighboring rulings of the grating may comprise a phase shift of about ¼ of this one spacing between neighboring rulings of the grating or about an odd number multiple of this ¼ spacing. This provides the advantage that the intensity of the wave guided along the strip waveguide will decrease towards the end faces of the strip waveguide and lower outcoupling of energy of the guided wave at the end faces which goes hand-in-hand therewith can effect a high degree of coupling between the guided wave and the beam.

In another improvement, mirrors are provided at least at the end faces of the strip waveguides. This embodiment or additional feature has the advantage that the grating regions in which the rulings of the gratings that are adjacent to one another comprise different spacings, such as mentioned hereinabove, can be foregone. So that the function of the diffraction grating comprising the one spacing between adjacent rulings of the grating in a specially efficient way, the rulings of the grating should be arranged in a suitable phase plane of the stationary wave field that is produced in the thin-film waveguide by the mirrors.

A further enhancement of the quality factor of the arrangement of the invention can be achieved when the mirrors are provided at lateral end faces on at least one layer of the thin-film waveguide that proceeds approximately in the running direction of the strip waveguide. These mirrors should thereby be placed so that the coupling or joining of the wave guided in the strip waveguides is advantageously influenced.

In order to increase the outcoupling efficiency of the arrangement of the invention acting as a resonator in the said beam that emerges from the thin-film waveguide, it is desirable that a mirror be arranged in the beam path of the wave being coupled out of the thin-film waveguide in a direction perpendicular to the running direction of the strip waveguides and perpendicular to the direction of the rulings of the grating. The mirror arrangement allows a beam emerging from the thin-film waveguide in the direction of this mirror to be superimposed on the beam emerging in the opposite direction.

The outcoupling efficiency can also be increased by an arrangement wherein the thin-film waveguide comprises a layer of material that is selected from a group of materials consisting of metal and insulators. On the base of the layer having an optically high reflective surface arranged suitably in the thin-film waveguide, the outcoupled power can be combined in an unidirectional beam.

A feature of the invention is that the planar thin-film waveguide is curved and, preferably, is doubly curved. This provides an improvement in view of focussing of the beam emerging from the thin-film waveguide perpendicularly relative to its surface. Particularly, in view of focusing of the beam into a point, it is advantageous that the doubly curved thin-film waveguide is spherically curved.

It is particularly advantageous to construct the arrangement so that the thin-film waveguide contains a material having a capability of optical intensification and that the arrangement has means for generating electrical charge carriers in the material having the capability of optical gain. This arrangement can be constructed with the strip waveguides being interrupted in the inner region of the thin-film waveguide and/or being provided in the regions of the thin-film waveguide which lie outside of the inner region. It is also advantageous to employ this structure as a semiconductor injection laser, particularly in combination with the feature of the strip waveguide proceeding next to one another in such a slight distance that electromagnetic and/or acoustical waves guided in the strip waveguides in the running direction thereof are coupled to one another.

Other advantages and features of the invention will be readily apparent from the following description of the preferred embodiments, the drawings and claims.

DESCRIPTION OF THE PREFERRED EMBODIMENTS

The principles of the present invention are particularly useful when incorporated into a thin-film waveguide DFW, which is composed of a central, wave-transmitting layer zS and of two wave-transmitting jacket or cladding layers MS1 and MS2, between which the central layer zS is arranged.

Figure 1:
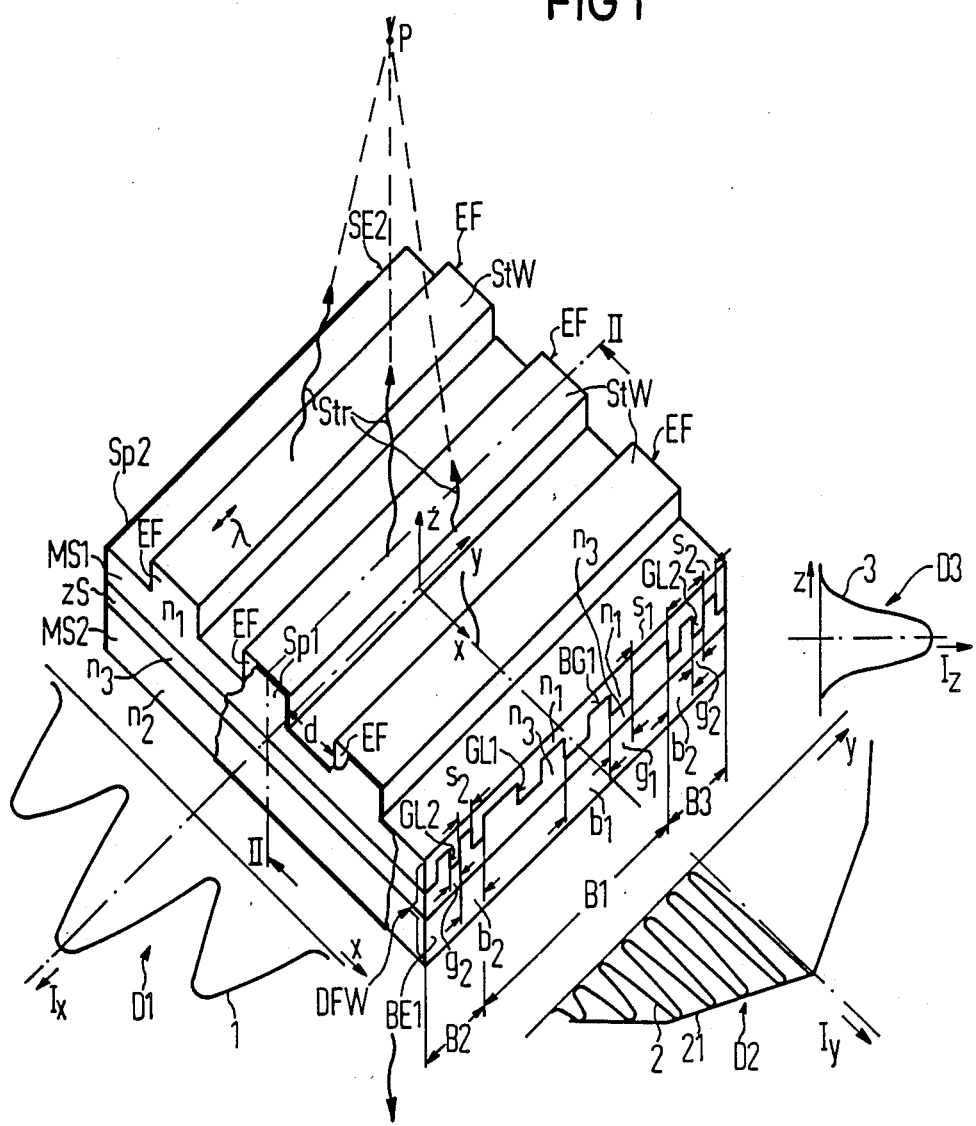
FIG. 1 is a schematic perspective view of an arrangement according to the present invention having a grating that comprises different spacings between neighboring rulings of the grating.
Figure 2:
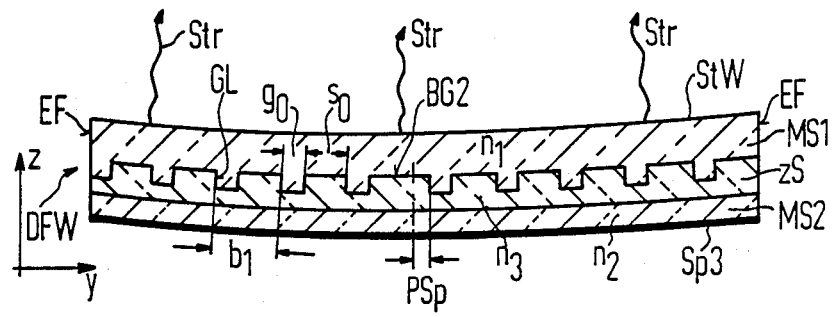
FIG. 2 is a cross sectional view taken approximately along the lines II—II of FIG. 1 of an embodiment with the diffraction grating having a fixed spacing between neighboring rulings of the grating and having a phase shift, and with the thin-film waveguide being slightly spherically curved.
Figure 3:
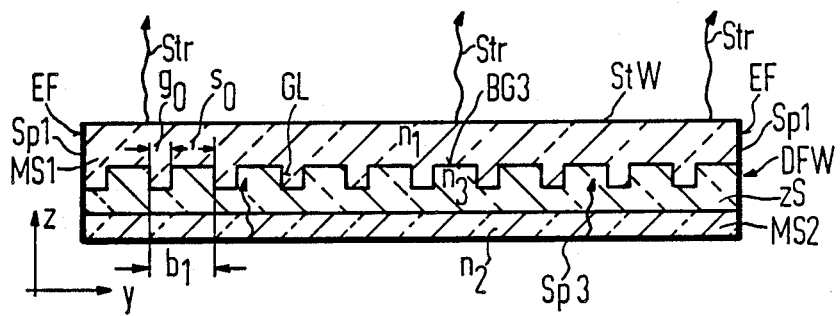
FIG. 3 is a vertical cross sectional view taken along a line II—II of an embodiment having a diffraction grating that has fixed spacing between neighboring rulings of the grating and wherein the mirrors are provided, particularly at the end faces of the strip waveguides.
Figure 4:
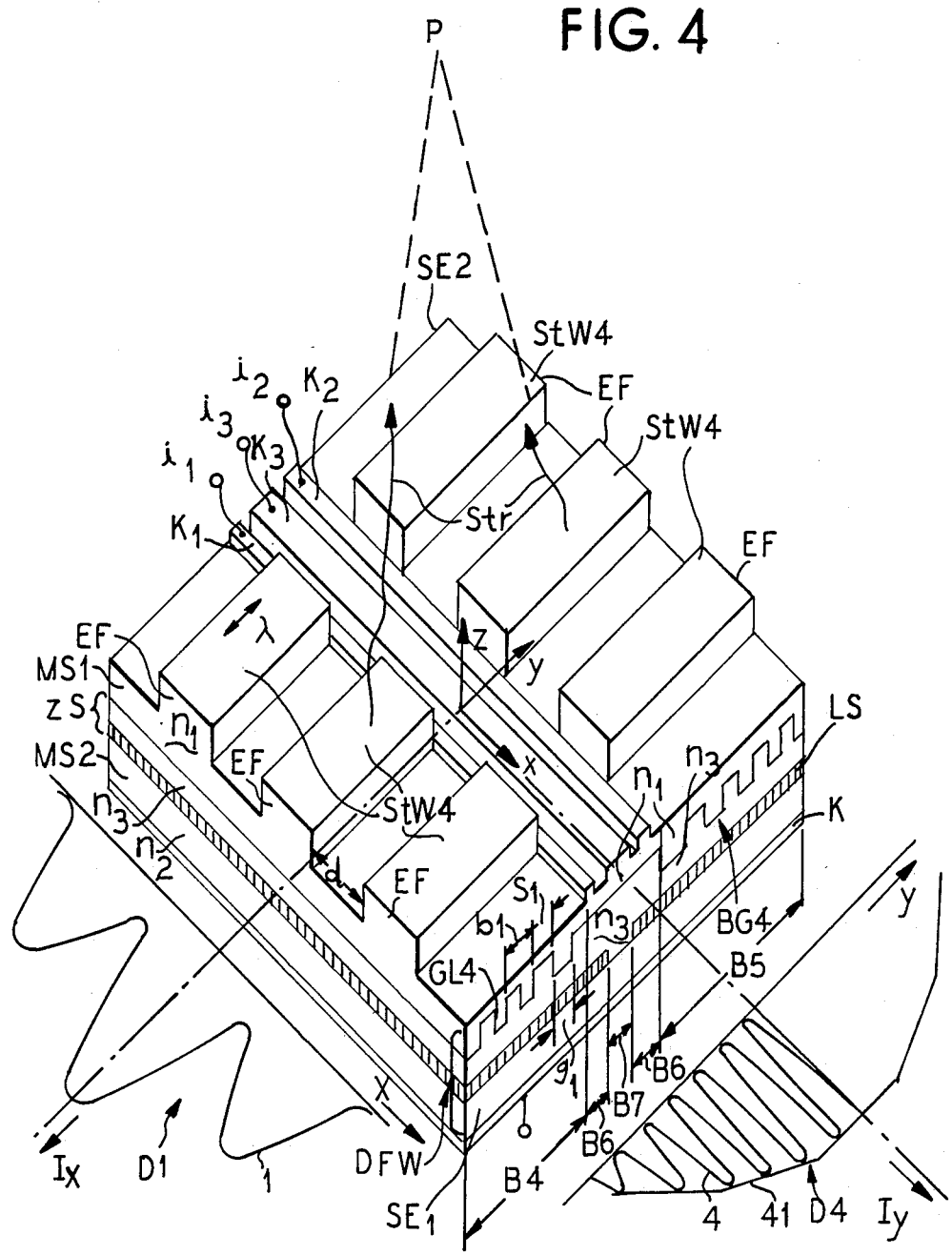
FIG. 4 is a schematic perspective view of a modification of the arrangement having special characteristics that the strip waveguide and the diffraction gratings are not executed in the inner region of the thin-film waveguide and the waveguide includes a laser active layer.

It should be noted that the thin-film waveguide is slightly curved, for example spherically curved, in all of the arrangements illustrated; however, this is only indicated in FIG. 2, and it is not illustrated in FIGS. 1, 3 and 4. In addition, each of the FIGS. 1-4, is provided with Cartesian coordinates x, y and z for purposes of orientation.

A refractive index $n_3$ of the central layer zS is higher than the refractive index $n_1$, $n_2$ of the jacket layer MS1 and MS2. The central layers zS and the jacket layers MS1 and MS2, therefore, act as waveguides for electromagnetic and/or for acoustical radiation traveling in the z-direction.

The outer boundary surface of the jacket layer, for example the outer boundary surface of the jacket layer MS1, contains a plurality of ridges and trenches that proceed parallel to the y-axis. The speed of an electromagnetic or acoustical wave migrating parallel to the y-axis is lower in the region of a ridge than it is laterally from the ridge. A ridge and its neighboring trenches, therefore, act as strip waveguides StW for electrmagnetic or acoustical radiation in the y-direction. The guided waves can be partially coupled or joined as a result of a small spatial distance d between neighboring strip waveguides StW.

A plurality of ridges and trenches are provided at another boundary surface, for example, a boundary surface between the central layer xS and the jacket layer, for example the layer MS1. This plurality of ridges and trenches proceeded essentially parallel to the x-axis and, thus, perpendicular to the running direction of the strip waveguides StW and, thus, form a one-dimensional diffraction grating BG1 for waves guided along the strip waveguides StW. The diffraction grating BG1 comprises an inner spacing grating region B1 having a first or one spacing b1, which extend between neighboring rulings GL1 of the grating. This inner grating region B1 is arranged between two outer grating regions B2 and B3 of the grating BG1, and these outer grating regions have a different second spacing b2 between neighboring rulings GL2 of the outer grating. In reference to the wave length of a wave guided in the thin-film waveguide in the grating regions B2 and B3, the second spacing b2 is half as large as the one or first spacing b1 between the neighboring rulings GL1 of the inner grating region B1 in reference to the wave length of the guided wave. The width of the ridges of the diffraction grating BG1 in the inner region B1 is referenced $s_1$ and the width of the trenches in this inner region B1 is referenced $g_1$. In the two outer regions B2 and B3, the width of the ridges of the grating is referenced $s_2$ and the width of the trenches is referenced $g_2$. The width $s_1$ or, respectively, the width $s_2$ of the ridges is equal to the width $g_1$ and $g_2$ of the trenches in every grating region B1, B2 and B3.

The function of the arrangement of FIG. 1 as a resonator shall be set forth wherein the following considerations apply when the wavel length $\lambda$ of the wave guided along a strip waveguide StW and, thus, along the y-axis is equal to the spacing b1 between the neighboring rulings GL1 of the grating of the diffraction grating BG1 in the inner region B1. The radiation migrating in the outer regions B2 and B3 of the diffraction grating BG1 is then reflected back to the inner region B1 of this grating BG1 (the grating of the first order). The radiation migrating in the region B1 is, thus, reflected back and is also coupled out in the direction of the z-axis and, thus, perpendicular to the strip waveguides StW (grating of the second order). This behavior is based on the principle of constructive interference due to multiple reflection.

A large part of the radiation coupled out departs the thin-film waveguide DFW in the direction of the z-axis and, thus, perpendicular to the plane of this waveguide as a beam Str. As a result of the spherical curvature of the thin-film waveguide DFW, the beam Str in the direction of the z-axis, for example in the direction of the positive z-axis, is focused onto a point P on the z-axis.

A part of the radiation coupled out perpendicularly from the strip waveguide StW by the diffraction grating migrates as a guided wave parallel to the x-axis and, thus, perpendicular to the running direction of the strip waveguides StW in the direction of the y-axis. When traversing neighboring strip waveguides StW, the diffraction grating BG1 couples power into these strip waveguides StW in its inner region B1. This coupling or joining of the strip waveguides StW is extremal when the distance d between neighboring strip waveguides StW amounts to a whole multiple of the path wave length $\lambda$ of the wave migrating in the x-direction.

Surrounding FIG. 1 are diagrams D1, D2 and D3. The diagram D1 has a curve 1 which indicates the intensity distribution $I_x(x)$ along the x-axis inside the central layer zS. The diagram D2 has a curve 2 which indicates the intensity distribution $I_y(y)$ along the y-axis inside the central layer xS. The diagram D3 has a curve 3 which shows the transversal distribution $I_z(z)$ of the intensity inside the thin-film waveguide DFW.

The curve 1 of the diagram D1 shows the intensity distribution $I_x$ of the fundamental mode of the coupled strip waveguides StW. The curve 1 achieves maximums inside the strip waveguides StW and minimums between the strip waveguides StW. When one proceeds from strip waveguides StW lying furthest towards the inside to the strip waveguide StW lying furthest towards the outside, then the value of the maximums increasingly decreases. This intensity distribution over the x-axis can be achieved when, for example, appropriate dimensions make it impossible for higher modes to propagate in the system of the coupled strip waveguides StW.

The curve 2 of the diagram Dw illustrates a possible longitudinal distribution $I_y$ of the intensity. In curve 2, the $I_y$ decreases when one proceeds from the center of the diffraction grating BG1 in the direction of an outer grating region B2 or B3 of this grating. As set forth above, the center grating region B1 of the diffraction grating BG1 couples radiation out of the thin-film waveguide DFW. This causes an exponential drop of an envelope 21 of the intensity distribution $I_y$ established by the curve 2. In the outer regions B2 and B3 of the diffraction grating BG1, the radiation is reflected back to the center of this grating. This causes a generally even greater exponential decrease of the envelope 21 of the curve 2.

As mentioned hereinabove, the curve 3 shows the transversal distribution $I_z$ of the intensity inside the thin-film waveguide DFW. This curve 3 specifically shows the intensity distribution of the transversal fundamental mode.

The arrangement shown in FIG. 1, thus, represents a thin-film resonator that enables efficient in-coupling and out-coupling of power via a beam Str that is essentially directed perpendicular to either the plane or the curve surface of the thin-film waveguide DFW.

The diffraction grating BG1 shown in FIG. 1 comprises an inner grating region B1 and outer grating regions B2 and B3, which can be combined in the diffraction grating of the second order whereby a spacing b1 between the neighboring rulings GL1 of the grating is equal to the wave length λ of the electromagnetic or acoustical wave that can be propagated in the thin-film waveguide DFW and in the strip waveguide StW or is equal to a whole multiple of at least twice of half this wave length λ and comprises a phase shift PSp, for example in the center, by about ¼ of the spacing b1 between the neighboring rulings GL1 of the grating or about an odd number multiple of this quarter length. FIG. 2 shows an arrangement comprising such a grating BG2. An enlargement of the emission surface or area is obtained by such a diffraction grating BG2 and, accompanying this, a sharper focusing of the emitted beam Str is obtained.

When given an arrangement according to FIG. 2, which arrangement has a diffraction grating BG2 of the second order, in order to achieve the reflection and vertical coupling out of radiation migrating in the waveguide DFW in a z-direction with the diffraction grating BG2, this diffraction grating BG2, preferably, comprises a ridge width $S_0$ or a trench width $g_0$ that is roughly equal to ¼ the spacing b1 of the ruling GL of this grating BG2 of the second order.

What the phase skip PSp achieves is that the resonator having distributed feedback is in resonance next to a Bragg wave length of the diffraction grating BG2. When the resonant wave length of the resonator lies in the proximity of the Bragg wave length of the grating BG2, maximums of the intensity distribution $I_x(x)$ (see FIG. 1 in this regard) decreases exponentially from the inside towards the outside. This decay of the intensity is advantageous for effecting emission in a vertical z-direction.

In order to enhance the quality factor of the resonator, mirrors Sp1, for example in the form of applied mirror layers, can be provided at the end faces EF at the end face of at least one layer MS1, zS, MS2 of at least one of the strip waveguides StW, as best illustrated in FIG. 3. The mirror Sp1 is partially shown in FIG. 1 with portions broken away. In this case, the outer grating regions B2 and B3 in FIG. 1 can be foregone and a diffraction grating BG3, as illustrated in FIG. 3, can be provided. The spacing b1 between the neighboring rulings GL1 of the grating BG3 is, again, equal to the wave length λ of the electromagnetic or acoustical wave that can be propagated in the thin-film waveguide DFW and in the strip waveguide StW.

In order to design the function of the diffraction grating BG3 efficiently, the rulings of the grating thereof should be arranged in a suitable phase plane of the stationary wave field formed by the mirror Sp1.

A further enhancement of the quality factor can be achieved by providing mirrors, such as Sp2, at lateral end faces or side faces, such as SE2 and BE1 of at least one layer Ms1, xS, MS2 of the thin-film waveguide DFW. These mirrors extend in the running direction, for example in the y-direction, of the strip waveguide StW. Such a mirror Sp2 in the form of a mirror layer is provided on the end face SE2 in FIG. 1. In particular, the lateral end faces BE1 and SE2 can lie at a side wall or inside one of the strip waveguides StW. Such a mirror could, likewise, be provided on the other end face BE1 as well, but is not illustrated as being placed thereon. The mirrors, such as Sp2, should be placed so that a potentially established coupling or joining of the strip waveguides StW by the inner grating region B1 of the diffraction grating BG1 or of the diffraction gratings BG2 or BG3 is advantageously influenced.

In order to increase the outcoupling efficiency of the resonator into the focused beam Str, a mirror Sp3 (see FIGS. 2 and 3) can be arranged in the beam path of the wave being coupled or beamed out of the thin-film waveguide DFW in a direction, for example, opposite the z-direction, and perpendicular to the running direction of the strip waveguides StW and perpendicular to the rulings GL1 and GL2 of the grating. This mirror Sp3 reflects this wave into the opposite direction, i.e., into the z-direction in the example, and superimposes it on the focused beam Str emerging in that direction. As a result of such a mirror Sp3, the beams Str of a plurality of resonators in the sense of the present invention, which are arranged along a line or in a plane, can also be superimposed on one another. As a result thereof, in particular, the optical waves in those resonators can be coupled phase locked. It can be advantageous that the mirror Sp3 is not applied on the substrate that carries one of the thin-film waveguides but is arranged at a defined distance or spacing from this substrate. Lenses for steering the waves can also be arranged between the resonator and the mirror Sp3.

The mirror layer, for example, can be formed by one or more highly reflective metal layers of, for example, gold, silver or copper, or can be formed by one or more dielectric layers. The mirror layer can also be part of a thin-film waveguide, so that a wave guided by the thin-film waveguide is in interaction with the mirror layer. The diffraction grating can also be directly introduced into the boundary surface of the mirror layer. In this case, the mirror Sp3 is formed by the jacket layer MS2 and the grating is situated in the boundary surface between the center layer zS and the jacket layer MS2.

In the arrangement of FIG. 4, the strip waveguide StW4 and the diffraction grating BG4 are situated in the outer regions B4 and B5 of a thin-film waveguide DFW. The strip waveguides StW4 and the diffraction grating BG4 are not executed in the inner regions B6 and B7 of the thin-film waveguide DFW. A layer LS, which is shown in shaded lines, is situated in the thin-film waveguide DFW, and this layer LS is composed of a material having the capability of spontaneous emission or optical amplification that emits radiation into the thin-film waveguide, given injection of currents $i_1$ and $i_2$ by contact layers K1 and K2 and a ground contact layer K, or given optical injection of light having a suitable wave length. This radiation is reflected at the rulings GL4 of the diffraction grating BG4 so that a laser wave can build up in the resonator. The outcoupling of the laser emission occurs in a z-direction vertically relative to the plane of the thin-film waveguide DFW with the assistance of the rulings GL4 of the grating. The layer LS is not provided in the region B7. By injection of the current $i_3$, application of electrical voltage via the contact layer K3 and the ground layer K4 or given optical injection of light of a suitable wave length, the refractive index $n_3$ of the layer becomes variable so that the phase of the wave guided in the thin-film waveguide in the region B7 is variable in a controlled fashion. By a suitable setting of the refractive index $n_3$, thus, a resonator having, for example, a quarter wave length phase skip can be obtained similar to the arrangement of FIG. 2, due to the phase shift PSp. The characteristics of the beam can also be set by controlling the refractive index $n_3$.

The curve 4 in the diagram D4 of FIG. 4 illustrates the intensity distribution $I_y(y)$ along the y-axis in which the interrupted strip waveguide StW4 proceeds. The curve 41 indicates an envelope of the intensity distribution established by the curve 4. As may be seen, the end face EF of the strip waveguides StW4 are loaded relatively little by the optical field so that when this arrangement operates as the laser, relatively high output powers are obtained.

The strip waveguides StW4 or the grating BG4 can also continue into the inner regions B6 and/or B7, respectively, and can be present there, as illustrated in FIGS. 1, 2 and 3. The layer LS can also be restricted to the inner region B6. The measure for suppressing the propagation of the higher modes, as addressed in conjunction with the discussion of curve 1 in FIG. 1, which may be potentially provided in the system of the coupled strip waveguide StW4, is not disturbed by an interaction between the layer LS and a wave guided by the strip waveguide StW4 and by the thin-film waveguide DFW.

The layer LS can also be limited in the strip waveguide StW4 or to the regions between the strip waveguides StW4. The reflection of the radiation guided in the thin-film waveguide DFW can also occur at the end face EF of the strip waveguide StW4. In this case, the grating for the vertical outcoupling of radiant intensity of waves guided in the z-direction can be optimized.

The region B7 can also be omitted. In this case, both the intensity, as well as the phase of the wave guided by the thin-film waveguides DFW and the regions B6 can be controlled by the currents $i_1$ and $i_2$.

The distribution of the charge carrier and the field layer LS having the refractive index $n_3$ can be set, not only by the injection of electrical charge carriers via contacts K, K1, K2 and K3, but also can be set by optical irradiation and optical pumping. The intensity and the phase of the wave guided by the thin-film waveguide DFW and by the strip waveguides StW4 can, therefore, be controlled by optical irradiation.

For explaining the functioning, the length of the strip waveguides in the y-direction in comparison to the extension of the contact layers K1, K2 and K3 in the y-direction is shown exaggerated in the arrangement of FIG. 4.

The arrangement of FIG. 4 is a realization of a semiconductor injection laser having coupled strip waveguides StW4 which is distinguished by the emission perpendicular to the plane or surface of these strip waveguides. To this end, the diffraction grating is dimensioned, as set forth in conjunction with FIGS. 1–4, so that the out-coupling efficiency between a wave guided by the thin-film waveguide and a beam becomes optimally high. As a result of this measure, the resonator loss can become so great that it is not the desired resonator mode but a resonator mode having low resonator loss that is stimulated without special measurements for mode selection.

Figure 5:
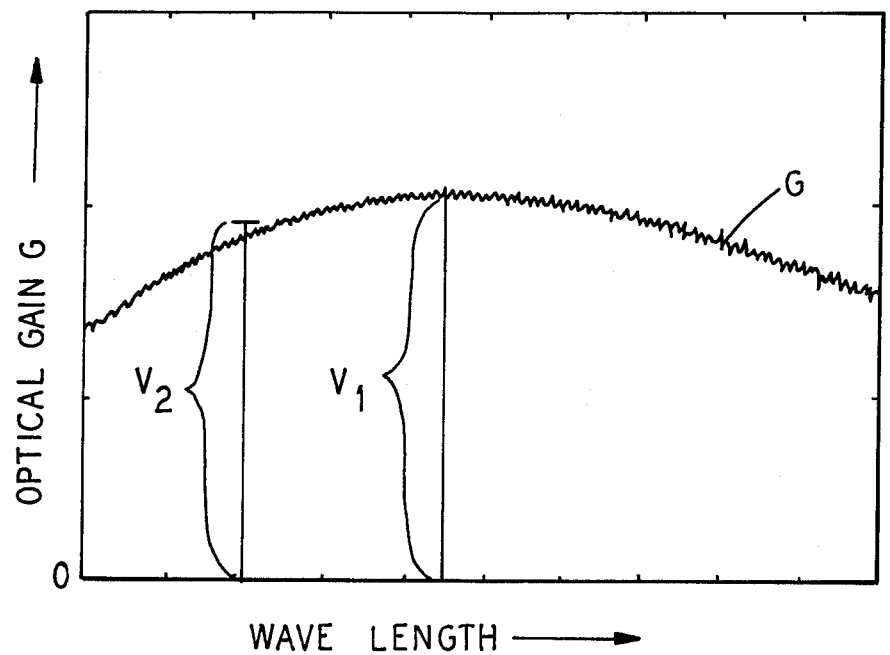
FIG. 5 is a graph showing the optical gain G as a function of the optical wave length; in addition, a resonator loss V1 of the mode having the highest coupling efficiency between the waveguide by the thin-film waveguide and the outcoupled beam and the resonator loss V2 of the spectrally next mode having the resonator loss of less than V1 are shown in this graph.

The function of the arrangement for maintaining an oscillation in the mode having the highest out-coupling efficiency is explained in FIG. 5. In FIG. 5, the curve G shows the optical gain of the layer LS as a function of the wave length. The line V1 indicates the resonator loss of the mode having the highest out-coupling efficiency. The line V2 indicates the resonator loss of the spectrally next resonator mode having lower losses than the mode having the highest output efficiency. The laser oscillation is excited in the mode having the highest coupling efficiency, since, according to FIG. 5, the resonator loss V1 thereof is compensated by the optical gain G. The mode having the lowest resonator loss lies at a wave length whereat the optical gain G does not compensate the resonator loss V2. A stimulation of this resonator mode is, therefore, not promoted.

For achieving mode selection according to FIG. 5, the resonator should comprise certain minimum values for the spectral spacing of neighboring modes so that the differences between optical gain G and resonator losses V1 and V2 can change to an adequate degree from mode to mode. For example, such mode spacing can be achieved with resonators wherein the extension of the stationary wave field in a running direction of at least one of the strip waveguides is shorter than 300 wave lengths of the wave guided in the strip waveguide. For example, such short resonators can be achieved with efficient grid reflectors, wherein at least two materials that form the boundary surface containing the grid comprise greatly different optical constants. Examples of such material combinations are semiconductor-insulator, semiconductor-metal, and insulator-metal. The insulator can, thereby, be formed by air or a vacuum.

For the application as a semiconductor injection laser, the thin-film waveguide DFW is composed of a double hetero structure of a waveguide having thin quantum well layers, for example, MQW waveguides, as disclosed in articles by Kojima et al "Edge-and surface-emitting distributed Bragg reflector laser with multiquantum well active/passive waveguides", *Appl. Phys. Lett.*, Vol. 50, No. 5, Feb. 2, 1987, pp. 227–229 or by an article by Miyamoto et al, "GaInAsP/InP Single Quantum-Well Lasers by OMVPE", *Japanese Journal of Applied Physics*, Vol. 26, No. 3, March 1987, pp. L176–L178. The thin-film waveguide DFW can also be composed of a waveguide having a large optical mode volume (LOC waveguides), as disclosed in an article by Botez et al. "Single-mode positive-index guided cm constricted doubleheterojunction large-optical-cavity AlGaAs lasers with low threshold-current temperature sensitivity", *Appl. Phys. Lett.*, Vol. 38, No. 9, May 1, 1981, pp. 658–660. In addition, the thin-film waveguide can be a waveguide having finely graduated refractive indices, such as a GRIN-SCH waveguide, as disclosed in an article by Derry et al. "Ultralow-threshold graded-index separate-confinement single quantum well buried heterostructure (Al,Ga)As lasers with high reflectivity coatings", *Appl. Phys. Lett.*, Vol. 50, No. 25, June 22, 1987, pp. 1773–1775. For example, the center layer zS is composed of a $Al_xGa_{1-x}As$ and the jacket layer MS1 and MS2 is composed of a p-doped or n-doped $Al_xGa_{1-x}As$, so that a double hetero structure is established. The thin-film waveguide DFW can also comprise a layer composed of $Ga_uIn_{1-u}As_vP_{1-v}$.

An arrangement comprising region B7, according to FIG. 4, is a realization of a phase modulator within a surface-emitting semiconductor injection laser having coupled strip waveguides. For this application, the thin-film waveguide DFW preferably contains a pin structure and the central layer, preferably, contains thin quantum well layers MQW (waveguide), as disclosed in an article from *Appl. Phys. Lett.*, Vol. 48 (1986), pp. 989–991. For example, the central layer zS is lightly doped or undoped and the jacket layer MS1 and MS2 are composed of lightly p-doped or, respectively, n-doped semiconductor material.

The strip waveguides StW and StW4 can be shaped, for example, in the form of ridges, as shown in FIGS. 1 and 4. They can also be buried waveguides, such as a buried hetero-structure waveguide or waveguides having disordered quantum well layers for example. Examples of these are taught by an article by Ishida et al, "Fabrication of Index-Guided AlGaAs Multiquantum Well Lasers with Buried Optical Guide by Si-Induced Disordering", *Japanese Journal of Applied Physics*, Vol. 25, No. 8, August 1986, pp. L690–L692.

The strip waveguides can also be coupled via waveguide branching, such as Y junctions (see, for example U.S. Pat. No. 4,255,717).

The rulings of the gratings, for example, can comprise the shape of ridges and trenches, as shown in FIG. 1. Due to the manufacture, the rulings of the grating can also assume other shapes, as desired, for example, can be formed by diffusion or implantation of suitable materials, for example of silicon ions.

With respect to the prior art, it should be pointed out that the strip waveguides having a laser active layer of multiple AlGaAs/GaAs quantum wells is disclosed in the above-mentioned article from *Appl. Phys. Lett.*, Vol. 50 (1987), pp. 227–229. The arrangement comprises only one strip waveguide outside of the region having a diffraction grating so that the efficient surface emission is not achieved.

Waveguides having disordered quantum wells are disclosed in the above-mentioned article from *Japanese Journal of Applied Physics*, Vol. 225, 1986, pp. L690–L692.

GaInAsP/InP lasers having a laser active material of quantum well layers are disclosed in the article from the *Japanese Journal of Applied Physics*, Vol. 26, 1987, pp. L176–L178.

Semiconductor injection lasers having large optical waveguide cross sections (large optical cavity, LOC) are disclosed in the above-mentioned article from the *Appl. Phys. Lett.*, Vol. 38, 1981, pages 658–660.

A surface emission of colinearly coupled strip lasers is reported in an article from *Appl. Phys. Lett.*, Vol. 50, 1987, pp. 659–661. The surface emission of laterally coupled strip waveguides, however, is not described.

An article from *Surface Science*, Vol. 168, 1986, pp. 847–851, describes component parts having multiple quantum well layers and hetero structures having graduated index profiles and separate carrier guidance (grated index separation carriers) confined here to structures of GRIN-SCH.

Additional prior art known to applicant are in U.S. Pat. Nos. 4,006,432; and 3,970,959. Also, Japanese Published Patent Application 60/186083.

Although various minor modifications may be suggested by those versed in the art, it should be understood that we wish to embody within the scope of the patent granted hereon all such modifications as reasonably and properly come within the scope of our contribution to the art.

I claim:

1. An arrangement comprising a planarly extending thin-film waveguide having a structure composed of a plurality of strip waveguides proceeding at a distance next to one another and a diffraction grating comprising rulings of the grating proceeding in a direction transversely relative to the running direction of the strip waveguides at the thin-film waveguide, said grating having a spacing between neighboring rulings at least equal to half the wave length of a wave being propagated in the thin-film waveguide, said wave being propagated in the thin-film waveguide being selected from electromagnetic and acoustical waves.

2. An arrangement according to claim 1, wherein the spacing between neighboring rulings of the grating is at least equal to the wavelength.

3. An arrangement according to claim 1, wherein the structure of the strip waveguides and the diffraction grating are superimposed on one another.

4. An arrangement according to claim 3, wherein the diffraction grating has an inner grating region having a first spacing between neighboring rulings of the grating, said inner grating region being arranged between two outer grating regions having a different second spacing between neighboring rulings of the grating, said second spacing with reference to the wavelength of a wave guided in the thin-film waveguide and in the strip waveguides of the outer regions is about half the size of the first spacing with reference to the wavelength of the wave guided in the thin-film waveguide in the strip waveguides of the inner region.

5. An arrangement according to claim 3, wherein the diffraction grating having a first spacing between neighboring rulings of the grating includes a phase shift, said phase shift having a spacing of at least an odd number multiple of ¼ of the spacing of the first spacing.

6. An arrangement according to claim 5, wherein the odd number multiple is 1.

7. An arrangement according to claim 1, which includes mirrors being provided on at least the end faces of the face ends of at least one of the layers of at least one of the strip waveguides.

8. An arrangement according to claim 1, which includes mirrors being provided on lateral end faces of at least one layer of the thin film waveguide and proceeding approximately in the running direction of the strip waveguides.

9. An arrangement according to claim 1, wherein a mirror is arranged in the beam path of the wave being coupled out of the thin waveguide in a direction along the z-direction and perpendicular to the running direction of the strip waveguide and perpendicular to the direction of the rulings of the grating.

10. An arrangement according to claim 1, wherein the thin film waveguide comprises a layer that is selected from a group of materials consisting of metal and insulators.

11. An arrangement according to claim 1, wherein the grating is at least partially situated in a boundary surface of a layer that is selected from a group of materials consisting of metal and insulators.

12. An arrangement according to claim 1, wherein the planar, thin-film waveguide is curved.

13. An arrangement according to claim 12, wherein the thin-film waveguide is doubly curved.

14. An arrangement according to claim 13, wherein the thin-film waveguide has a spherical curvature.

15. An arrangement according to claim 1, wherein the strip waveguides proceed next to one another at such a slight distance that the wave propagated in the strip waveguides in the running direction are coupled to one another.

16. An arrangement according to claim 1, wherein the thin-film waveguide comprises a double hetero structure.

17. An arrangement according to claim 1, wherein the thin-film waveguide comprises a layer composed of a material selected from a group consisting of $Al_x Ga_{1-x}As$, and $Ga_u In_{1-u} As_v P_{1-v}$.

18. An arrangement according to claim 1, wherein the thin-film waveguide comprises quantum well layers.

19. An arrangement according to claim 1, wherein at least one strip waveguide is fashioned in the form of a ridge.

20. An arrangement according to claim 1, wherein at least one strip waveguide is fashioned in the form of a buried waveguide.

21. An arrangement according to claim 1, wherein each strip waveguide is fashioned in the form of a waveguide comprising at least partially disordered potential quantum well layers.

22. An arrangement according to claim 1, wherein the rulings of the diffraction grating are defined by ridges separated by trenches, said ridges and trenches in the region having a fixed spacing between neighboring rules having identical widths.

23. An arrangement according to claim 1, wherein the rulings of the diffraction gratings are defined by ridges separated by trenches, said ridges having widths in the regions having fixed spacing between neighboring rulings of the grating being three times larger than a width of the trenches.

24. An arrangement according to claim 1, wherein the strip waveguides proceed next to one another at such a slight distance that waves propagated in the strip waveguide in the running direction are coupled to one another, said thin-film waveguides containing material having a capability of optical gain and means for generating electrical charge carriers in the material having the capability of optical gain being present on the thin-film waveguide.

25. An arrangement according to claim 24, wherein the thin-film waveguide contains a PIN structure and means for influencing the distribution of electrical charge carriers in this PIN structure and that the propagation of the guided electromagnetic wave can be influenced by the distribution of electrical charge carriers.

26. An arrangement according to claim 24, wherein the stationary wave field in a running direction of at least one of the strip waveguides is shorter than 300 wavelengths of a wave guided in said strip waveguide.

27. An arrangement according to claim 24, wherein the rulings of the grating in a running direction of at least one of the strip waveguides extends over less than 300 wavelengths of the wave guided in said strip waveguide.

28. An arrangement according to claim 24, wherein the strip waveguides are interrupted in an inner region of the thin-film waveguide so that they are provided only in the regions of the waveguide lying outside of the inner region.

29. A semiconductor injection laser having a thin-film waveguide containing a laser active material and a guided electromagnetic wave being generated in the thin-film waveguide by injection of a charge carrier, said thin-film waveguide having a structure composed of a plurality of strip waveguides proceeding at a distance next to one another and a diffraction grating comprising rulings of a grating proceeding in a direction transversely relative to the running direction of the strip waveguides being fashioned at the thin-film waveguide, the spacing between neighboring rulings of the grating being equal to at least a half of the wave length of the electromagnetic wave being propagated in the thin-film waveguide, and said laser having emission along a z-axis extending perpendicular to both the running direction of the strip waveguides and the direction of the rulings of the gratings.

30. An arrangement comprising a planarly extending thin-film waveguide having a structure composed of a plurality of stripped waveguides proceeding at a distance next to one another; and the thin-film waveguide having a pin structure and means for influencing distribution electrical charge carriers in said pin structure so that the propagation of an electromagnetic wave guided in the thin-film waveguide can be influenced by the distribution of the electrical charge carriers.

31. An arrangement according to claim 30, wherein the stripped waveguides extend at such a slight distance next to one another that electromagnetic waves guided in the stripped waveguides in a running direction thereof are coupled to one another.

32. An arrangement according to claim 30, wherein the thin-film waveguide contains material having capabilities of optical intensification and in that means for generating electrical charge carriers in said material having the capabilities of optical intensification are present in the thin-film waveguide.

33. An arrangement according to claim 30, wherein a diffraction grating having rulings of the grating extending in a direction transverse relative to the running direction of the stripped waveguides is provided at the thin-film waveguide, the neighboring rulings of said grating having a distance therebetween being at least equal to half of the wave length of an electromagnetic wave that is capable of propagation in the thin-film waveguide and in the stripped waveguides.

* * * * *